(12) United States Patent
Jentzsch et al.

(10) Patent No.: US 11,495,939 B2
(45) Date of Patent: Nov. 8, 2022

(54) SEMICONDUCTOR LASER

(71) Applicant: OSRAM OLED GmbH, Regensburg (DE)

(72) Inventors: Bruno Jentzsch, Regensburg (DE); Alvaro Gomez-Iglesias, Regensburg (DE); Alexander Tonkikh, Wenzenbach (DE); Stefan Illek, Donaustauf (DE)

(73) Assignee: OSRAM OLED GMBH, Regensburg (DE)

( * ) Notice: Subject to any disclaimer, the term of this patent is extended or adjusted under 35 U.S.C. 154(b) by 226 days.

(21) Appl. No.: 16/977,888

(22) PCT Filed: Mar. 5, 2019

(86) PCT No.: PCT/EP2019/055386
§ 371 (c)(1),
(2) Date: Sep. 3, 2020

(87) PCT Pub. No.: WO2019/170636
PCT Pub. Date: Sep. 12, 2019

(65) Prior Publication Data
US 2021/0006033 A1   Jan. 7, 2021

(30) Foreign Application Priority Data
Mar. 6, 2018   (DE) .......................... 102018105080.1

(51) Int. Cl.
*H01S 5/026* (2006.01)
*H01S 5/02* (2006.01)
(Continued)

(52) U.S. Cl.
CPC .......... *H01S 5/0267* (2013.01); *H01S 5/0217* (2013.01); *H01S 5/0287* (2013.01);
(Continued)

(58) Field of Classification Search
CPC .......... H01S 5/0267; H01S 5/02; H01S 5/028
See application file for complete search history.

(56) References Cited

U.S. PATENT DOCUMENTS 4,658,402 A * 4/1987 Kobayashi ............... H01S 5/18
372/96
5,282,080 A   1/1994 Scifres et al.
(Continued)

FOREIGN PATENT DOCUMENTS

EP   0935319 A2   8/1999
EP   2043210 A2   4/2009
(Continued)

OTHER PUBLICATIONS

Shinoda et al., "Monolithically Lens-Integrated Photonic Device Arrays for Compact Optical Transceivers", Japanese Journal of Applied Physics, 2013, vol. 52, 8 pages.

*Primary Examiner* — Tuan N Nguyen
(74) *Attorney, Agent, or Firm* — MH2 Technology Law Group LLP

(57) ABSTRACT

A semiconductor laser is provided that includes a semiconductor layer sequence and electrical contact surfaces. The semiconductor layer sequence includes a waveguide with an active zone. Furthermore, the semiconductor layer sequence includes a first and a second cladding layer, between which the waveguide is located. At least one oblique facet is formed on the semiconductor layer sequence, which has an angle of 45° to a resonator axis with a tolerance of at most 10°. This facet forms a reflection surface towards the first cladding layer for laser radiation generated during operation. A maximum thickness of the first cladding layer is between 0.5 M/n and 10 M/n at least in a radiation passage region, wherein n is the average refractive index of the first cladding layer and M is the vacuum wavelength of maximum intensity of the laser radiation.

20 Claims, 6 Drawing Sheets

(51) Int. Cl.
*H01S 5/028* (2006.01)
*H01S 5/10* (2021.01)
*H01S 5/20* (2006.01)

(52) U.S. Cl.
CPC .......... *H01S 5/1064* (2013.01); *H01S 5/1085* (2013.01); *H01S 5/20* (2013.01)

(56) References Cited

U.S. PATENT DOCUMENTS

| | | | |
|---|---|---|---|
| 8,179,940 B2 * | 5/2012 | Brick | B82Y 20/00 |
| | | | 372/49.01 |
| 2002/0154664 A1 | 10/2002 | Okubo | |
| 2009/0097519 A1 | 4/2009 | Brick et al. | |
| 2011/0051226 A1 * | 3/2011 | Valli | H01S 3/109 |
| | | | 359/326 |

FOREIGN PATENT DOCUMENTS

| | | | |
|---|---|---|---|
| JP | 2015162566 A | 9/2015 |
| JP | 2017187709 A | 10/2017 |
| WO | 2017169741 A1 | 10/2017 |

* cited by examiner

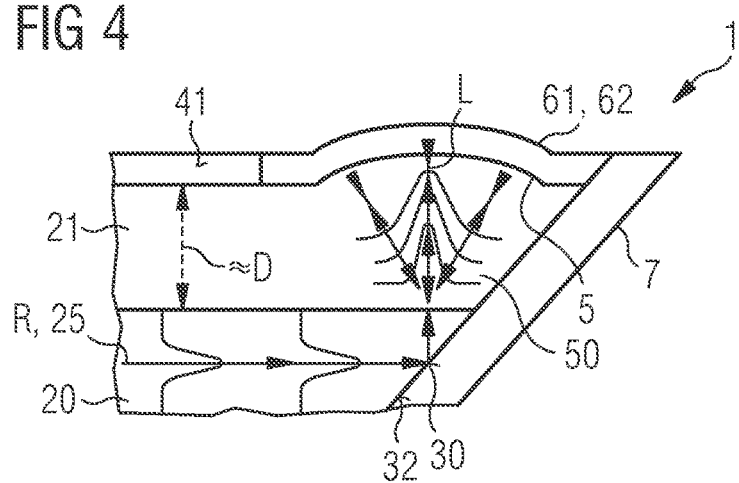
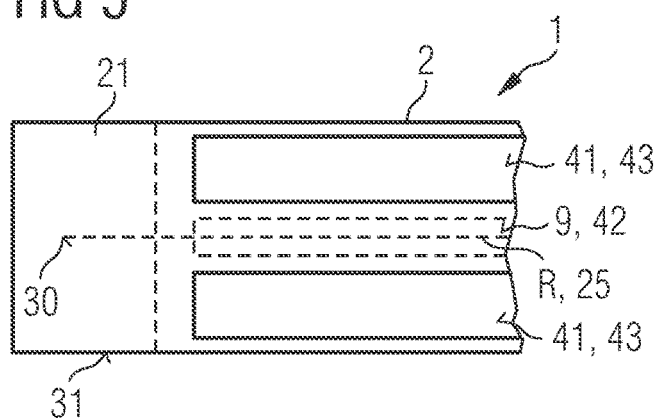
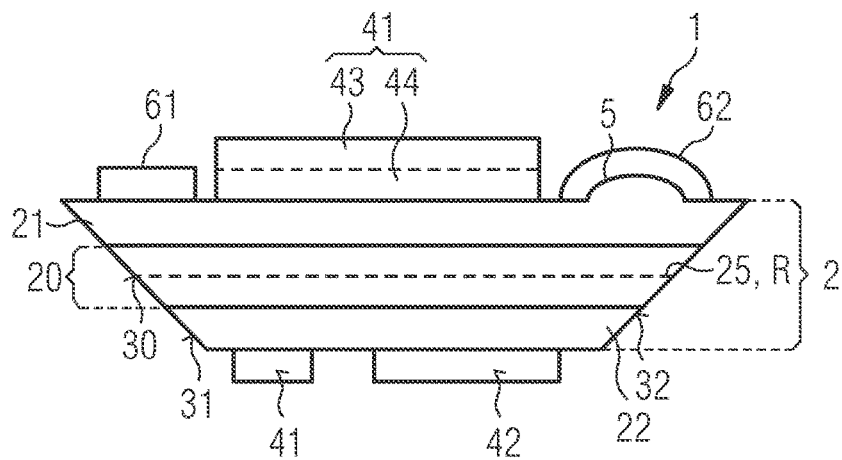
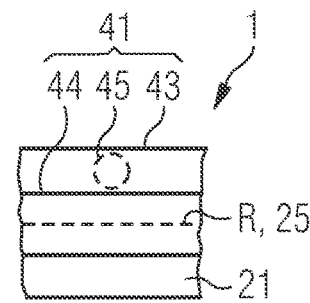

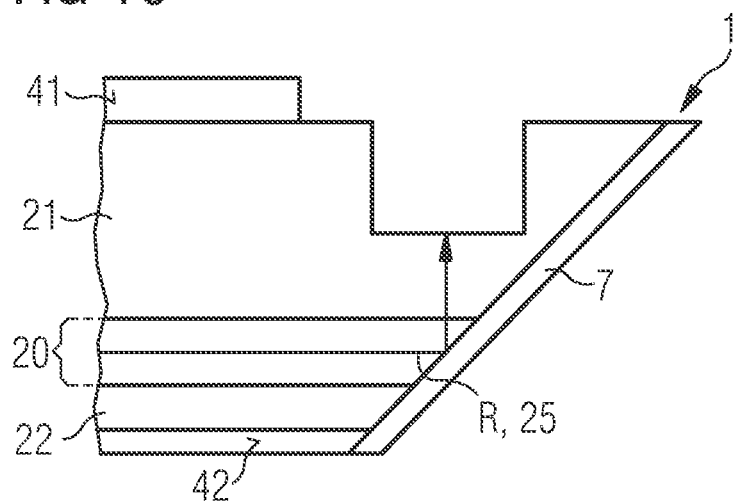
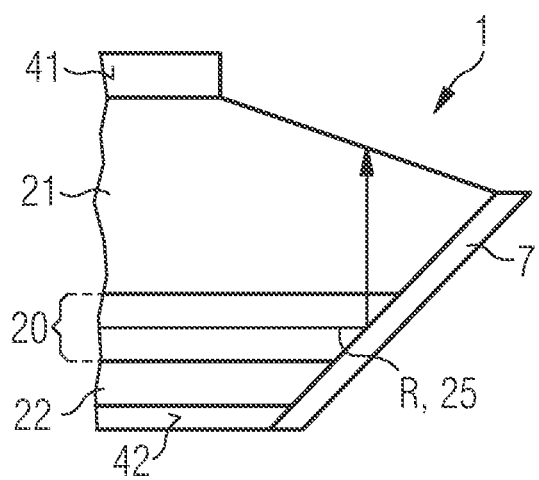

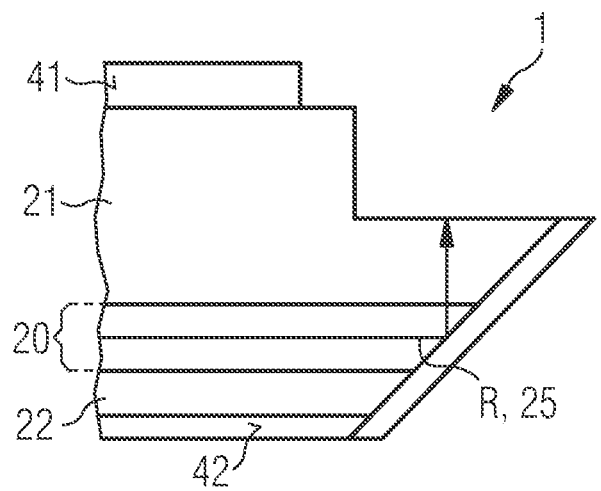
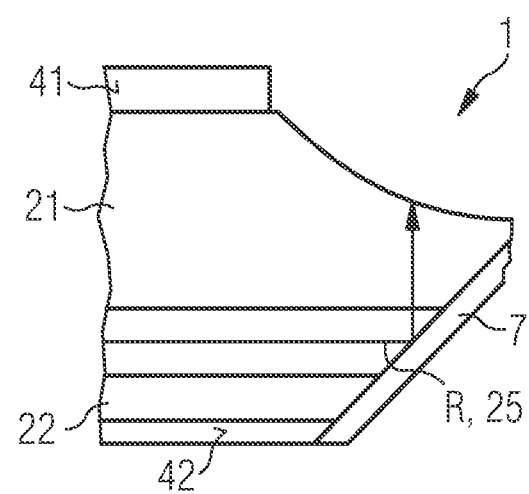

SEMICONDUCTOR LASER

CROSS-REFERENCE TO RELATED APPLICATIONS

This patent application is a national stage entry from International Application No. PCT/EP2019/055386, filed on Mar. 5, 2019, published as International Publication No. WO 2019/170636 A1 on Sep. 12, 2019, and claims priority under 35 U.S.C. § 119 from German patent application 10 2018 105 080.1, filed Mar. 6, 2018, the entire contents of all of which are incorporated by reference herein.

A semiconductor laser is specified.

In the publication US 2009/0097519 A1 a semiconductor laser with oblique facets is specified.

A task to be solved is to specify a semiconductor laser that may be efficiently manufactured.

This task is solved, among other things, by a semiconductor laser with the features of claim 1. Preferred further embodiments are subject of the other claims.

According to at least one embodiments, the semiconductor laser comprises a semiconductor layer sequence. The semiconductor layer sequence includes a waveguide. The waveguide contains an active zone for the generation of laser radiation. The waveguide with the active zone is configured to guide the generated laser radiation, in particular by means of total internal reflection. This means that the waveguide has a relatively high optical refractive index for the laser radiation.

The semiconductor layer sequence is preferably based on a III-V compound semiconductor material. The semiconductor material is for example a nitride compound semiconductor material such as $Al_nIn_{1-n-m}Ga_mN$ or a phosphide compound semiconductor material such as $Al_nIn_{1-n-m}Ga_mP$ or an arsenide compound semiconductor material such as $Al_nIn_{1-n-m}Ga_mAs$ or such as $Al_nGa_mIn_{1-n-m}As_kP_{1-k}$, where $0 \leq n \leq 1$, $0 \leq m \leq 1$ and $n+m \leq 1$ and $0 \leq k < 1$ respectively. Preferably for at least one layer or for all layers of the semiconductor layer sequence $0 < n \leq 0.8$, $0.4 \leq m < 1$ and $n+m \leq 0.95$ as well as $0 < k \leq 0.5$. The semiconductor layer sequence may contain dopants as well as additional components. For the sake of simplicity, however, only the essential constituents of the crystal lattice of the semiconductor layer sequence, i.e. Al, As, Ga, In, N or P, are given, even if these may be partially replaced and/or supplemented by small amounts of other substances.

According to at least one embodiment, the semiconductor layer sequence comprises a first and a second cladding layer. The waveguide is located between these two cladding layers. It is possible that the waveguide directly adjoins the cladding layers. The cladding layers have a lower refractive index for laser radiation than the waveguide.

According to at least one embodiment, at least one oblique facet is formed on the semiconductor layer sequence. The oblique facet or oblique facets have an angle of 45° to a resonator axis and/or to a main extension direction of the active zone. The angle of 45° is achieved in particular with a tolerance of at most 10° or 5° or 2° or 1°. The resonator axis and thus a resonator of the semiconductor laser preferably run along a straight line so that the resonator may be strip-shaped.

According to at least one embodiment, the oblique facet is formed as a reflection surface for the laser radiation towards the first cladding layer. This means that the laser radiation generated in the active zone during operation is guided in the waveguide towards the oblique facet and reflected there in the direction of the first cladding layer. The waveguide may reach up to the facet so that the waveguide is terminated and confined by the facet.

According to at least one embodiment, a maximum thickness of the first cladding layer, at least in a radiation passage region for the laser radiation above the reflection surface, is at least 0.5 M/n or 1 M/n or 3 or 5 M/n or 7 M/n. Where M is the vacuum wavelength of maximum intensity of the laser radiation generated during operation and n is the average refractive index of the first cladding layer for the vacuum wavelength, in particular at the specified operating temperature of the semiconductor laser or also at room temperature, i.e., 300 K. Alternatively or additionally, the maximum thickness in the radiation passage region is at most 10 M/n or 7 M/n or 4 M/n. In the case of AlGaAs, the maximum thickness is between 2 μm and 3 μm.

The radiation passage region is in particular that region of the semiconductor layer sequence which, seen in plan view, lies above a point of intersection of the waveguide with the obliquely arranged facet. Radiation passage regions may be the only regions of the first cladding layer through which the laser radiation is intended to pass in a direction parallel or approximately parallel to a growth direction of the semiconductor layer sequence.

According to at least one embodiment, the semiconductor laser comprises electrical contact surfaces. The two or the more than two electrical contact surfaces are arranged for external electrical contacting of the semiconductor laser. The contact surfaces are preferably solderable or electrically conductively adhesive.

In at least one embodiment, the semiconductor laser comprises a semiconductor layer sequence and electrical contact surfaces. The semiconductor layer sequence includes a waveguide with an active zone. Furthermore, the semiconductor layer sequence includes a first and a second cladding layer between which the waveguide is located. At least one oblique facet is formed on the semiconductor layer sequence, which has an angle of 45° to a resonator axis and to a main extension direction of the active zone with a tolerance of at most 10°. This facet forms a reflection surface towards the first cladding layer for laser radiation generated in the active zone during operation. A maximum thickness of the first cladding layer is between 0.5 M/n and 10 M/n inclusive at least in a radiation passage region above the reflection surface, where n is the average refractive index of the first cladding layer and M is the vacuum wavelength of maximum intensity of the laser radiation.

Most common laser diodes are produced as edge-emitting lasers and have coated facets. During production of such lasers, wafers must be split into strips, resulting in two facets opposite each other. These facets are successively coated, followed by separation into individual laser diode chips and bonding to suitable carriers. In particular, splitting into the strips results in additional processing steps and additional processing time, which contribute significantly to the production costs of such semiconductor lasers. In contrast, the semiconductor laser described here can be produced in a wafer compound and/or at wafer level, accompanied by significant cost savings.

Alternative possibilities for lasers are surface-emitting semiconductor lasers with a vertical cavity, also known as VCSELs or Vertical Cavity Surface Emitting Lasers. Such surface-emitting lasers can also be produced in a wafer compound and have relatively low production costs. However, VCSELs have a very short cavity, suffer from thermal problems and are limited in their optical output power. In contrast, high optical output powers can be achieved with the semiconductor laser described here.

In the semiconductor laser described here, which can be manufactured completely in a wafer compound and at wafer level, light amplification occurs parallel to an active zone and thus perpendicular to a growth direction, as is the case in conventional edge-emitting lasers. Deflection mirrors in the form of the oblique facets are integrated. Especially in combination with thin-film technology, in which a growth substrate is removed from the semiconductor layer sequence, this allows efficient vertical light extraction at high optical output powers.

The facets, preferably etched at 45°, result in total internal reflection, also known as TIR, for radiation coming from the waveguide. In order to avoid losses at the facets and when coupling out the radiation, the corresponding conditions for total internal reflection must be fulfilled over an entire range of an angular distribution of the guided light. This requires that a refractive index of a material at the facet is adjusted accordingly and that an intensity profile of the laser radiation in the waveguide is optimized.

In particular, the latter point can be achieved by selecting the first cladding layer as thin as possible in order to reduce or avoid beam expansion within the first cladding layer in the direction parallel to the active zone. For example, in the AlInGaAs material system and for wavelengths around 940 nm, the limiting angle for internal total reflection is only about 16°. This means that even a small beam expansion in the first cladding layer can lead to significant optical losses.

However, it should be noted that with increasing maximum thickness, the intensity fed back into the waveguide decreases independently of the divergence angle due to the beam widening, since the overlap of the reflected intensity distribution decreases with the intensity distribution of the waveguide, also called mode reflection. The divergence angle of the laser radiation also enters the mode reflection due to the critical angle of total reflection, all light outside this critical angle is to be considered as loss for the laser. The divergence angle is given in particular by the geometry of the waveguide, i.e. layer thickness and refractive index. The intensity distribution of the guided laser radiation, i.e., the mode, should be as wide as possible, which can be achieved by a weak wave guidance, combined with low refractive index differences and/or wide waveguide. However, this limits the choice of the maximum thickness downwards, so that a compromise is necessary.

To improve light extraction efficiency, optically active coatings such as anti-reflection coatings and highly reflection coatings may be applied to interfaces of the first cladding layer facing away from the active zone. In addition, a degree of reflection may be adjusted via such coatings and thus a portion of the laser radiation can be guided from a light extraction surface of the first cladding layer back into a resonator for the laser radiation. Furthermore, it is possible to increase the power of the semiconductor laser by shaping the first cladding layer in a form of a lens in the radiation passage region in order to correct mode expansion and to ensure improved feedback of the radiation into the cavity and the active zone. This allows a proportion of the reflected radiation that is fed back into the cavity for amplification to be increased to 90% or more.

With the semiconductor laser described here, it is possible to create all optically effective coatings directly in the wafer compound. In particular, by removing the growth substrate, it is possible to ensure that the light reflected from the facets only has to travel a short distance outside the waveguide without guidance. This means that the semiconductor laser described here can reduce the manufacturing costs towards the costs of light-emitting diodes, or LEDs for short.

The deflection of the radiation and the vertical emission allow additional freedom in the manufacturing process and in the design. An efficient scaling of the optical output power is possible by integrating several waveguides into a single laser diode chip, which can be efficiently mounted electrically and mechanically. Furthermore, it is possible to test the semiconductor lasers described here during production while they are still in wafer compound, i.e. especially before they are separated into individual semiconductor laser chips or laser bars.

A high efficiency of the semiconductor laser according to the invention can be achieved in particular by achieving a minimum unguided path length for the laser radiation outside the waveguide. Furthermore, high efficiency is preferably supported by high reflectivity at the oblique facet and by a lenticular design of the first cladding layer at the radiation passage region. The removal of the growth substrate also makes it possible to select suitable carriers, for example to reduce thermal resistance when cooling the semiconductor laser.

According to at least one embodiment, the semiconductor laser is a surface-emitting laser. This means that the laser radiation is emitted perpendicular to the active zone and parallel to a growth direction of the semiconductor layer sequence.

According to at least one embodiment, the resonator axis of the semiconductor laser is aligned parallel to the main extension direction of the active zone. The resonator axis lies inside the waveguide. The waveguide reaches up to the facet. Alternatively, the waveguide and/or an energized region of the active zone has a small distance from the oblique facet, preferably at least 0.5 µm and/or at most 50 µm or 20 µm or 10 µm. Such a distance of the waveguide and/or the energized region of the active zone from the facet can prevent damage to the facet.

If the upper, first contact surface is too close to the facet, the optical losses at this contact surface increase. A distance of the upper, first contact surface to the oblique facet should, for example, at an angle of 45° preferably be at least equal to the thickness of the etched epitaxial material, i.e., especially of the first cladding layer.

Furthermore, a current expansion, which can be limited and optimized by the material of the first cladding layer, electrically pumps the active zone, although the upper, first contact surface is retracted from the facet. In other words, ideally the waveguide is pumped and supplied with current up to the facet, but no light is lost at the upper, second contact surface. This is particularly important if the angle of the oblique facet is not exactly 45° and the light is not deflected vertically but possibly in the direction of the second contact surface.

Thus, current widening and charge carrier diffusion due to the upper, first cladding layer can contribute to increased efficiency. A higher charge carrier mobility in the upper, second cladding layer should be selected in particular if the first contact surface is formed with a metallic component and if, in order to avoid absorption losses, this metallic component is located next to the resonator axis when viewed from above. In this case, a current supply to the active zone is made, for example, solely via the first cladding layer.

A gain zone of the semiconductor laser, in which in particular only the active zone is supplied with current, is preferably linear along the resonator axis. A width of the gain zone in a direction perpendicular to the resonator axis is preferably at least 1 µm or 5 µm and/or at most 0.2 mm or 0.1 mm or 50 µm. A length of the resonator axis along the waveguide is preferably at least 0.2 mm or 0.4 mm and/or at most 5 mm or 3 mm.

According to at least one embodiment, the semiconductor layer sequence represents a waveguide structure only in a direction parallel to the active zone. In the direction perpendicular to the active zone from the facet, however, the wave may propagate freely in the first cladding layer. Thus, there are no refractive index variations within the first cladding layer.

According to at least one embodiment, the first cladding layer is shaped in at least one radiation passage region as a lens for refocusing at least a part of the laser radiation which is returned to the active zone. Such refocusing increases the efficiency, since an increased portion of the reflected laser radiation is fed back into the waveguide and is not lost as scattered light.

According to at least one embodiment, the lens is shaped as an elevation over remaining regions of the first cladding layer. This means that the maximum thickness of the first cladding layer may be in a center of the lens. Alternatively, it is possible that the lens is formed in a recess of the first cladding layer, so that the first cladding layer can be thicker outside the at least one radiation passage region than in the region of the lens.

According to at least one embodiment, the following relationship applies to a curvature $R(z)$ of the lens: $R(z)=z[1+(z0/z)^2]$, preferably with a tolerance of at most 0.2 z0 or 0.05 z0, where $z0=\pi*n*\omega0^2/\lambda$, wherein z is the distance between the waveguide and an exit facet and is thus in the range of the maximum thickness of the first cladding layer. n is the refractive index of the first cladding layer, $\lambda$ is the wavelength of maximum intensity of the laser radiation and $\omega0$ is the effective half width of the mode in the waveguide at 1/e times the amplitude. For the above formula and the determination of the corresponding values, it is refer to the book Laser Electronics, third edition, by Joseph T. Verdeyen, Pearson-Verlag, 1995, ISBN-10: 013706666X, ISBN-13: 978-0137066667. The revelatory content of this book is included by back-reference, in particular Chapter 3.4—Physical Description of $TEM_{0,0}$ Mode, especially FIG. 3.2 and the corresponding description.

For example $\omega0=0.3$ µm at a distance z of about 2.5 µm from the exit facet, which, at a refractive index of n about 3.4 and a wavelength of about 940 nm, corresponds to an approximately ideal radius of curvature R of about 2.8 µm. At the exit facet, after an unguided pass through the first cladding layer, the mode already has a width of co of about 0.8 µm and assuming that the mode is reflected there on a straight facet, the mode widens even more on the return path. Consequently, the modal part that is coupled back into the waveguide is strongly reduced by a reflection at a straight facet. In contrast, an etched lens with a radius of curvature of R~2.8 µm will cancel this broadening effect. This example is intended to illustrate the effect of the corrective lens. In the case of a narrower or wider mode, note that the approximately ideal radius of curvature takes on a different value. This also applies to a different cladding thickness of the first cladding layer, a different refractive index and a different wavelength under consideration.

According to at least one embodiment, the first cladding layer does not exceed the maximum thickness even outside the radiation passage region. This means that a thickest part of the first cladding layer may be the maximum thickness in the radiation passage region. In particular, the thickest point of the first cladding layer may be the center of the lens.

According to at least one embodiment, the electrical contact surfaces are located or at least one of the electrical contact surfaces is located directly on the associated cladding layer or cladding layers and/or semiconductor contact layers. If semiconductor contact layers are present, for example highly doped thin marginal layers of the semiconductor layer sequence, the semiconductor contact layers are preferably located directly on the respective associated cladding layer. The semiconductor contact layers preferably have a thickness of at most 0.5 µm or 0.1 µm.

According to at least one embodiment, a metallic component of the electrical contact surface, which is located on the first cladding layer, is located exclusively next to the resonator axis in plan view. This prevents laser radiation guided along the resonator axis from reaching such metallic components via an evanescent field penetrating the first cladding layer. This makes it possible to avoid or reduce absorption losses at such metallic components.

According to at least one embodiment, the electrical contact surface located on the first cladding layer comprises a component made of a transparent conductive oxide. This component is preferably located directly at the semiconductor layer sequence. The transparent conductive oxide, or TCO for short, is transparent to the laser radiation and has no or only slight absorbing properties.

According to at least one embodiment, a refractive index of the transparent component of the first contact surface for the laser radiation is smaller or equal to the refractive index of the first cladding layer. This means that these transparent components of the electrical contact surface can be regarded as part of the cladding layer with regard to the optical effect.

According to at least one embodiment, the semiconductor layer sequence is shaped as a symmetrical trapezium when viewed in cross-section. This means in particular that the resonator axis is confined at opposite ends in each case by a facet, which has an angle of 45° to the resonator axis with a tolerance of at most 10° or 5° or 2°. The trapezoid thus narrows in the direction of the second lateral surface, which is not penetrated by the laser radiation as intended. The aforementioned cross-section preferably runs through the resonator axis and perpendicular to the active zone.

According to at least one embodiment, the semiconductor laser comprises exactly one optically effective facet which is aligned oblique to the resonator axis. This means that there may be exactly one optically effective facet which confines the resonator axis and which is preferably arranged perpendicular to the resonator axis, for example with a tolerance of at most 10° or 5° or 2°. However, all optically effective facets are preferably formed by slopes of approximately 45° to the resonator axis.

According to at least one embodiment, the first cladding layer at the radiation passage region is provided with an anti-reflection coating for the laser radiation. A reflectivity of the first cladding layer for the laser radiation at the anti-reflection coating is, for example, at most 20% or 10% or 5%. Instead of an anti-reflection coating, a resonator reflection with a relatively high reflectivity may be applied, for example with a reflectivity of at least 20% and/or at most 70%.

According to at least one embodiment, a reflection coating for the laser radiation is located at at least one other point on the first cladding layer, which is oriented parallel to the active zone with a tolerance of at most 20° or 10°. The reflection coating preferably has a reflectivity for the laser radiation of at least 80% or 90% or 95% or 99%. Therefore, the reflection coating can be a highly reflective coating. The reflection coating can be present on the lens.

According to at least one embodiment, the at least one reflection surface or one of the reflection surfaces or all reflection surfaces of the facets are provided with a mirror for the laser radiation. The mirror is preferably located directly on the corresponding facet and/or reflecting surface.

According to at least one embodiment, the mirror has a dielectric layer or layer sequence directly on the reflection surface and/or in a region closest to the reflection surface. The dielectric layer preferably has a low refractive index for the laser radiation, for example of at most 1.7 or 1.5. A refractive index difference between the semiconductor layer sequence and the dielectric layer is preferably at least 0.7 or 1.5. In the case of a dielectric layer sequence, there are alternately layers with high and low refractive index, in particular at least three and/or at most twelve layers. For example, there are four layers which alternately have refractive indices for laser radiation of 2.25 and 1.45, preferably each with a tolerance of at most 0.1 or 0.05.

According to at least one embodiment, the mirror comprises a metal layer, for example of gold, silver and/or aluminium. The metal layer is preferably located on a side of the dielectric layer facing away from the reflection surface. The dielectric layer is configured for total internal reflection of the laser radiation at the facet. Any laser radiation passing through the dielectric layer can be reflected at the metal layer. It is possible that there is a passivation layer or protective layer on a side of the metal layer facing away from the facet.

According to at least one embodiment, the semiconductor layer sequence is completely enveloped by the electrical contact surfaces together with optically effective coating when viewed in cross-section. The optically effective coatings are in particular the mirror, the reflection coating and/or the anti-reflection coating. The aforementioned cross-section preferably runs through the resonator axis and perpendicular to the active zone. This means that the electrical contact surfaces and the optically effective coatings can simultaneously protect the semiconductor layer sequence, for example from environmental influences.

According to at least one embodiment, the semiconductor laser is free of a growth substrate for the semiconductor layer sequence. This means that the growth substrate was removed from the semiconductor layer sequence during the production of the semiconductor laser. In particular, there is no growth substrate at the first cladding layer, which is preferably n-doped.

According to at least one embodiment, the semiconductor laser comprises a pottin. The potting is arranged on at least one of the facets. For example, the potting is located on a side of the associated mirror that faces away from the reflection surface. Due to the potting, it is possible that the semiconductor laser is cuboidal when viewed in cross-section. This simplifies the handling of the semiconductor laser and the facets can be protected efficiently.

In the following, a semiconductor laser described here is explained in more detail with reference to the drawings using exemplary embodiments. Identical reference signs indicate identical elements in the individual figures. However, size relationships are not shown true to scale; individual elements may be shown in exaggerated size for better understanding.

In the Figures:

FIGS. 1 to 4 show schematic sectional views of exemplary embodiments of semiconductor lasers described here.

FIG. 5 shows a schematic plan view of an exemplary embodiment of a semiconductor laser described here.

Figure 7:
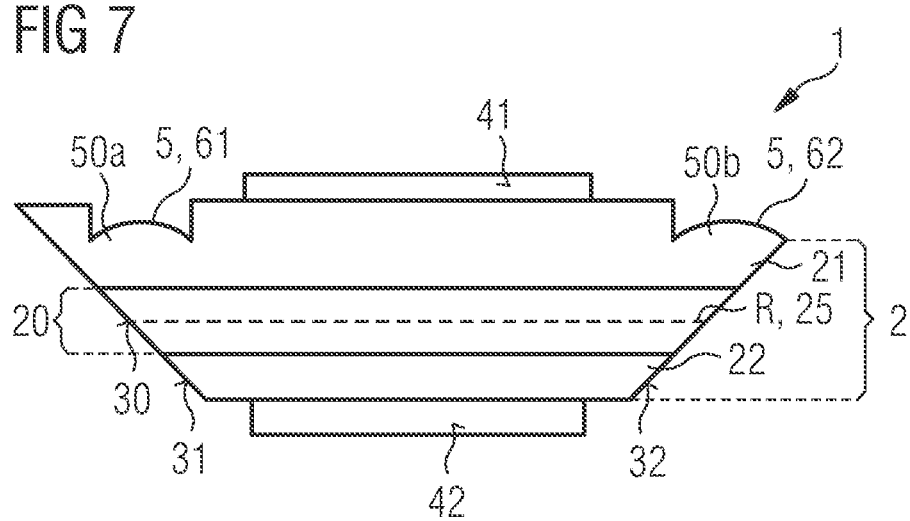
Figure 8:
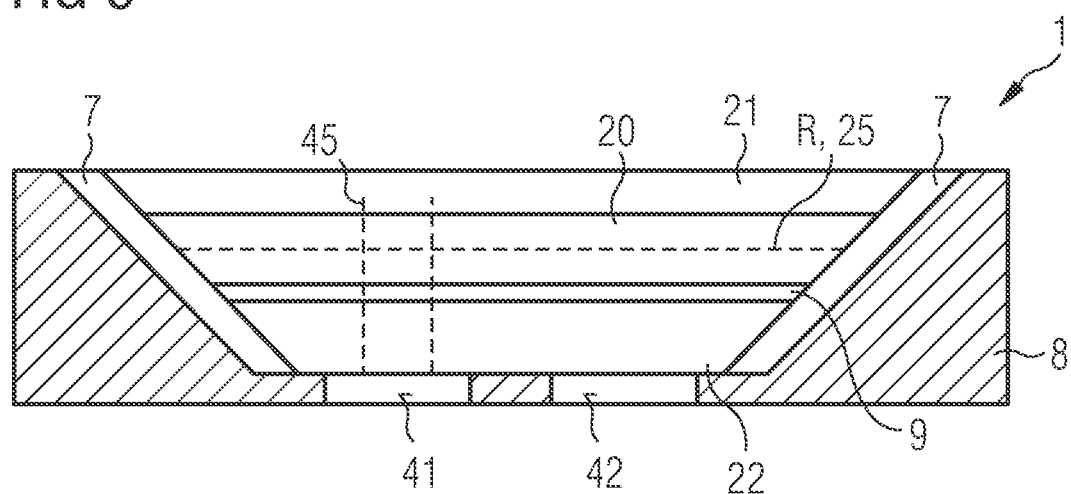
Figure 9:
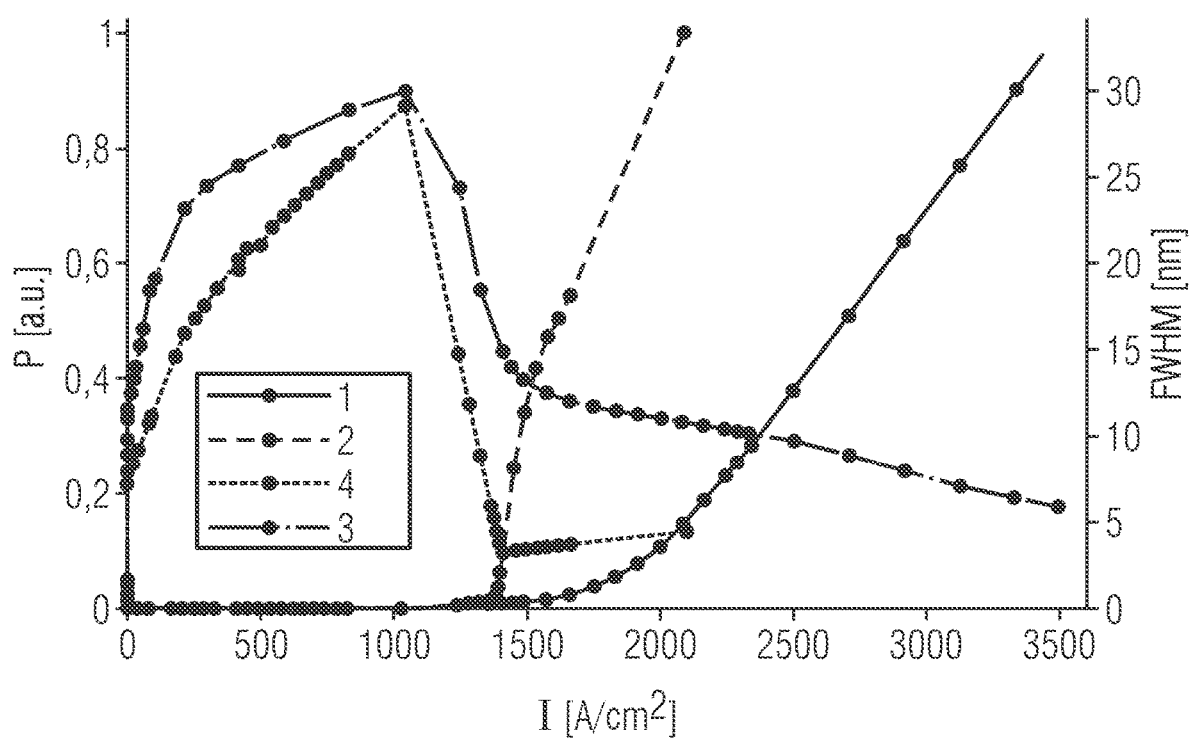

FIG. 6 in figure part A shows a sectional view and figure part B shows a plan view of an exemplary embodiment of a semiconductor laser described here, FIGS. 7 and 8 schematic sectional views of exemplary embodiments of semiconductor lasers described here, FIG. 9 is a schematic diagram of electro-optical characteristics of an exemplary embodiment of a semiconductor laser described here, and FIGS. 10 to 13 schematic sectional views of exemplary embodiments of semiconductor lasers described here.

Figure 1:
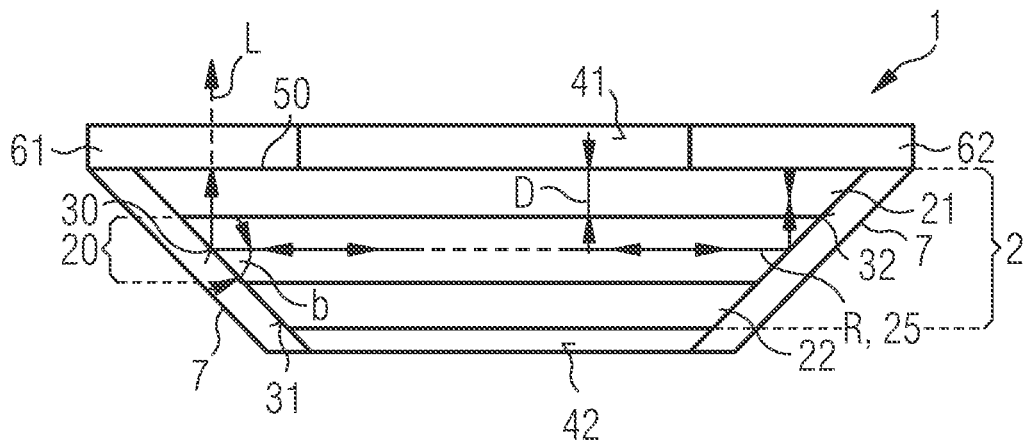

FIG. 1 shows an exemplary embodiment of a semiconductor laser 1. The semiconductor laser 1 comprises a semiconductor layer sequence 2, preferably from the AlInGaAs material system. The semiconductor layer sequence 2 contains a waveguide 20. The waveguide 20 contains an active zone 25 for generating laser radiation L. The active zone 25 also defines a straight resonator axis R that runs parallel to a main direction of the active zone 25. The resonator axis R extends to facets 31, 32 of the semiconductor layer sequence 2.

Furthermore, the waveguide 20 is located between a first cladding layer 21 and a second cladding layer 22. The cladding layers 21, 22 have a lower refractive index than the waveguide 20. Thus, due to total internal reflection the laser radiation L is guided along the resonator axis R. The cladding layers 21, 22 are free of waveguide structures. The cladding layers 21, 22, for example, are made of AlGaAs with an aluminum content of at least 20% and/or at most 70%. The first cladding layer 21 is preferably n-doped and the second cladding layer 22 is preferably p-doped.

On sides of the waveguide layers 21, 22 facing away from the waveguide 20 electrical contact surfaces 41, 42 for external electrical contacting of the semiconductor laser 1 are arranged. The contact surfaces 41, 42 are preferably metallic contact surfaces which may be composed of one or more metal layers.

The facets 31, 32 of the semiconductor layer sequence 2 are configured to guide the laser radiation L generated in the active zone 25 towards the first cladding layer 21 and through the first cladding layer 21. For this purpose the facets 31, 32 are tilted by 45° with respect to the resonator axis R. Total internal reflection of the laser radiation L occurs at the facets 31, 32 so that reflection surfaces 30 are formed at the facets 31, 32.

Preferably, facets 31, 32 or even just the reflection surface 30 on the waveguide 20 are provided with a mirror 7. Boundary surfaces of the first cladding layer 21 facing away from the active zone 25 are provided with an anti-reflection coating 61 and with a reflection coating 62. At the anti-reflection coating 61, the laser radiation L is out-coupled from the first cladding layer 21. At the reflection coating 62, the laser radiation L that has passed through the first cladding layer 21 is reflected back into the waveguide 20.

In the case of AlGaAs for the first cladding layer 21, the refractive index of the first cladding layer 21 is about 3.5, so that a total internal reflection angle at the interface towards the anti-reflection layer 61 is typically only about 16°. For example, a maximum thickness D of the first cladding layer 41 is at most 2.5 µm or 1.5 µm or 0.7 µm. This means that radiation passage regions 50, in particular, in which the laser radiation L passes through the first cladding layer 21, have only a small thickness.

In cross-section, the entire semiconductor layer sequence 2 may be completely surrounded and enclosed by the contact surfaces 41, 42 together with the optically effective coatings 61, 62, 7.

Figure 2:
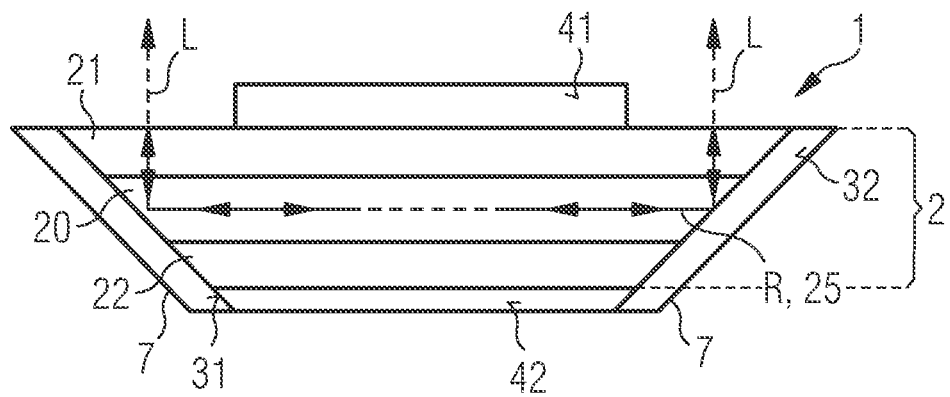

In the exemplary embodiment of FIG. 2, no reflection or anti-reflection coatings are applied to the first cladding layer 21. This makes it possible for the semiconductor laser 1 to emit laser radiation L on two surface regions. As an alternative to being designed as a semiconductor laser, such a component can also be designed as a superluminescent diode, as illustrated in FIG. 2. In all other respects, the statements on FIG. 1 apply accordingly.

Figure 3:
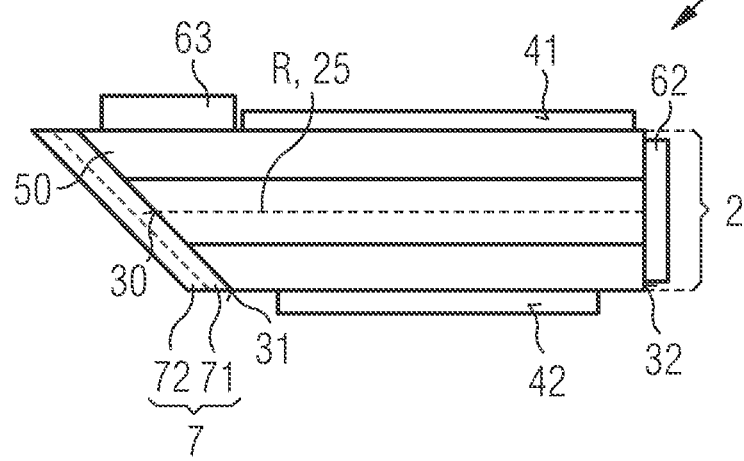

FIG. 3 illustrates that a diffractive optical element 63 may also be present as an optically effective coating at the radiation passage region 50 for coupling out the laser radiation L. This allows, for example, eye-safe semiconductor lasers 1 to be realized.

FIG. 3 also shows that the mirror 7 is composed of a dielectric layer 71 and a metal layer 72. The dielectric layer 71 may serve as passivation of the semiconductor layer sequence 2. For example, the dielectric layer 71 is made of an electrically insulating oxide such as silicon oxide or aluminium oxide or a nitride such as silicon nitride or aluminium nitride. The thickness of the dielectric layer 71 is preferably relatively small, for example not more than 1 μm or 0.5 μm. In particular, the optical thickness of the dielectric layer 71 is at most twice or four times a vacuum wavelength of laser radiation L divided by the average refractive index of the dielectric layer 71.

On a side of the dielectric layer 71 facing away from the semiconductor layer sequence 2 preferably a metal layer 72 is arranged, which acts as a non-totally reflecting, mirror layer for the laser radiation L. For example, the metal layer 72 is made of gold, especially with a thickness of at least 0.1 μm or 0.2 μm.

Such a mirror 7 and such a diffractive optical element 63 may accordingly be present in all other exemplary embodiments.

Furthermore, FIG. 3 shows that the semiconductor layer sequence 2 is only half trapezoidal in cross-section. Thus the second facet 32, on which the reflection coating 62 is preferably located, is oriented perpendicular to the resonator axis R and to the active zone 25. Preferably, however, as illustrated in FIGS. 1 and 2, both facets 31, 32 are oriented at an angle to the resonator axis R.

Apart from this, the remarks made in particular in connection with FIG. 1 apply accordingly.

FIG. 4 shows that the first cladding layer 21 is provided with a lens 5 in the radiation passage region 50. The lens 5 may be formed as an elevation over remaining regions of the cladding layer 21. Through the lens 5 a refocusing of the laser radiation L into the waveguide 20 is achieved. A propagation of a mode of the laser radiation L is only shown schematically in FIG. 4. Since the lens 5 is formed as an elevation, remaining region of the first cladding layer 21 have approximately the maximum thickness D.

The lens 5 is preferably provided with one of the optically effective coatings 61, 62. In particular, such a lens 5 is located on a reflection side of the first cladding layer 21 where no radiation from the semiconductor layer sequence 2 is coupled out, so that the coating is a reflection coating 62.

Apart from this, the remarks made in particular regarding FIG. 1 apply accordingly.

The plan view of FIG. 5 shows that the first contact surface 41 is formed with metallic components 43. In order to avoid absorption losses of the laser radiation L at the first contact surface 41 due to the thin first cladding layer 21, these metallic components 43 are located next to the resonator axis R in plan view. A current supply to the active zone 25 is carried out, for example, via a TCO-layer that is not drawn here or via the first cladding layer 21 alone.

A current limitation and/or a limitation of an amplification zone for the laser radiation transverse to the resonator axis R can be achieved by a current limiting layer 9 and/or by the correspondingly structured second electrical contact surface 42. Such a current confinement layer 9 can also be present in all other exemplary. It is thus possible that the semiconductor laser 1 is designed as a gain-guided laser. Alternatively, as also possible in all other exemplary embodiments, the semiconductor laser may be a stripe laser with a stripe waveguide, also known as a ridge waveguide. In the latter case, in particular the first cladding layer 21 next to the resonator axis R is partially removed in order to effect wave guidance also in the direction transverse to the resonator axis R.

FIG. 5 shows that the semiconductor laser 1 comprises only a single resonator axis R and thus only a single laser unit. Deviating from this, there may be several of the resonator axes R and thus several resonators and laser units, which are preferably all aligned parallel to each other. The various laser units and resonators may be controlled independently of one another or electrically together. The same applies to all other exemplary embodiments.

Apart from that, the remarks made in particular in FIGS. 1, 3 and 4 apply accordingly.

In the exemplary embodiment of FIG. 6, the lens 5 is optionally provided only on the side with the reflection coating 62. In addition, the contact surfaces 41, 42 are located together on a lower side of the semiconductor layer sequence 2, i.e., on the second cladding layer 22. Here, the first contact surface 41 is preferably electrically separated from the cladding layer 22. The parts of the contact surface 41 on the first cladding layer 21 are preferably composed of a TCO component 44 and the metallic component 43. Due to the TCO component 44, which is transparent to the laser radiation L, the first cladding layer 21 may be made particularly thin.

If both contact surfaces 41, 42 are located on the underside of the semiconductor laser 1, the part of the first contact surface 41 on the first cladding layer 21 is preferably connected to the contact surface 41 on the underside via one or more electrical through-connections 45. This allows the semiconductor laser to be surface-mounted.

Apart from this, the remarks made in particular in FIGS. 1, 3, 4 and 5 apply accordingly.

In the exemplary embodiment in FIG. 7, the first cladding layer 21 in the region of the two radiation passage regions 50a, 50b is differently formed. Thus the lens 5 in the radiation passage region 50b reaches up to the facet 32.

In contrast, the lens 5 in the radiation passage region 50a is arranged in a recess in the first cladding layer 21. This means that this lens 5 does not extend to facet 31.

Deviating from FIG. 7, both lenses 5 in the radiation passage regions 50a, 50b can also have the same form. Corresponding forms of the lenses 5 as well as the radiation passage region 50a, 50b may be present in all other exemplary embodiments.

According to FIG. 8, the first cladding layer 21 may be connected to the contact surface 41 on the underside via the through-connection 45. A current limitation to the linear amplification zone along the resonator axis R is achieved, for example, via the current limiting layer 9 and/or via a geometry of the electrical supply via the second electrical contact surface 42. A corresponding electrical contact can also be present in all other exemplary embodiments.

Curves 1 and 2 in FIG. 9 show the optical output power P as a function of the current density I. Curves 3 and 4 refer to a spectral width of the generated laser radiation. Particular attention is paid to the component of FIG. 1. Curves 1 and 3 refer to the case where the anti-reflection coating 61 is present. In curves 2 and 4, there is no anti-reflection coating and no reflection coating 62 present.

FIG. 9 shows that without anti-reflection coating the laser threshold starts at lower current densities and that a smaller spectral width can be achieved. With anti-reflection coating, a greater spectral width can be achieved than would be the case without anti-reflection coating.

In the exemplary embodiment of FIG. 12 it is shown that instead of a lens, a simple step is etched into the upper, first cladding layer 21. As an alternative to a step, a shaft may be provided in the upper, first cladding layer 21, see FIG. 10. In these exemplary embodiments, a thicker first cladding layer 21 in particular is possible without the mode in the unguided part becoming significantly wider.

As an alternative to a lens, an adiabatic or bevelled exit facet could also improve the performance of semiconductor laser 1, see FIGS. 13 and 11. Among other things, such exit facets make it possible to compensate for oblique facets 31, 32 that are not exactly at 45°.

Unless otherwise indicated, the components shown in the figures preferably follow each other directly in the order given. Layers not touching each other in the figures are preferably spaced apart. If lines are drawn parallel to each other, the corresponding surfaces are preferably aligned parallel to each other. Likewise, unless otherwise indicated, the relative positions of the drawn components to each other are correctly shown in the figures.

The invention is not restricted to the exemplary embodiments by the description on the basis of said exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

REFERENCE SIGNS 1 semiconductor laser
2 semiconductor layer sequence
20 waveguide
21 first cladding layer
22 second cladding layer
25 active zone
30 reflection surface
31 first facet
32 second facet
41 first electrical contact surface
42 second electrical contact surface
43 metallic component of the first contact surface
44 TCT-component of the first contact surface
45 through-connection
5 lens for refocusing of the laser radiation
50 radiation passage region of the first cladding layer
61 anti-reflection coating
62 reflection coating
63 diffractive element
7 mirror Spiegel
71 dielectric layer
72 metal layer
8 potting
9 current limitation layer
D maximal thickness of the first cladding layer above the reflection surface
FWHM full width at half maximum of the spectrum of the laser radiation in nm
I current density in $A/cm^2$
L laser radiation
M wavelength of maximal intensity of the laser radiation
P optical power of the laser radiation in arbitrary units
R main extension direction of the active Zone/resonator axis
b angle between the facet and the resonator axis

The invention claimed is:

1. A semiconductor laser comprising a semiconductor layer sequence and with electrical contact surfaces, wherein
the semiconductor layer sequence comprises a waveguide with an active zone,
the semiconductor layer sequence comprises a first and a second cladding layer between which the waveguide is located,
at least one facet is formed on the semiconductor layer sequence, which has an angle of 45° to a resonator axis and to a main extension direction of the active zone with a tolerance of at most 10°, so that this facet is a reflection surface towards the first cladding layer for laser radiation generated in the active zone during operation, and
a maximum thickness of the first cladding layer at least in a radiation passage region above the reflection surface is between 0.5 M/n and 10 M/n inclusive, and n is the average refractive index of the first cladding layer and M is the vacuum wavelength of maximum intensity of the laser radiation,
wherein the electrical contact surface located on the first cladding layer comprises a component of a transparent conductive oxide which is transparent to the laser radiation, and
wherein a refractive index of this component is smaller than or equal to the refractive index of the first cladding layer.

2. The semiconductor laser according to claim 1, which is a surface-emitting laser
wherein the resonator axis is parallel to the main extension direction of the active zone in the waveguide, and the waveguide has a higher refractive index for the laser radiation than the first and second cladding layers,
wherein the first cladding layer is free of a waveguide structure for the laser radiation, so that the laser radiation propagates freely in the direction perpendicular to the active zone in the first cladding layer.

3. The semiconductor laser according to claim 1,
wherein the first cladding layer in the radiation passage region is formed as a lens for refocusing a part of the laser radiation which is returned to the active zone.

4. The semiconductor laser according to claim 3,
wherein the lens is shaped as an elevation over remaining regions of the first cladding layer so that the maximum thickness of the first cladding layer is at a center of the lens.

5. The semiconductor laser according to claim 3,
wherein the following relationship applies to a curvature of the lens: $R(z)=z[1+(z0/z)^2]$, with a tolerance of 0.05 z0,
wherein $z0=\pi*n*\omega0^2/\lambda$, and z is the distance between the waveguide and an exit facet, n is the refractive index of the first cladding layer, $\lambda$ is the wavelength of maximum intensity of the laser radiation and $\omega0$ is the effective half-width of the mode in the waveguide at 1/e times the amplitude.

6. The semiconductor laser according to claim 1, wherein a maximum thickness of the first cladding layer is between 0.5 M/n and 10 M/n, inclusive.

7. The semiconductor laser according to claim 1, wherein the electrical contact surfaces are each arranged directly on the cladding layers and/or on semiconductor contact layers which are located directly on the cladding layers and which have a thickness of at most 0.5 µm.

8. The semiconductor laser according to claim 1, wherein metallic components of the electrical contact surface, which is arranged on the first cladding layer, lie exclusively next to the resonator axis in plan view.

9. The semiconductor laser according to claim 1, wherein the semiconductor layer sequence, viewed in cross-section, is shaped as a symmetrical trapezium, so that the resonator axis is confined at opposite ends in each case by a facet which has an angle of 45° to the resonator axis with a tolerance of at most 10°.

10. The semiconductor laser according to claim 1, wherein exactly one facet of the semiconductor layer sequence, which confines the resonator axis, is arranged perpendicular to the resonator axis with a tolerance of at most 10°.

11. The semiconductor laser according to claim 1, wherein the first cladding layer at the radiation passage region is provided with an anti-reflection coating for the laser radiation.

12. The semiconductor laser according to claim 1, wherein a reflection coating for the laser radiation is located at at least one other point of the first cladding layer, which is oriented parallel to the active zone with a tolerance of at most 20°.

13. The semiconductor laser according to claim 1, wherein the at least one reflection surface is provided with a mirror for the laser radiation.

14. The semiconductor laser according to claim 13, wherein the mirror has a dielectric layer with a refractive index of at most 1.7 for the laser radiation directly on the reflection surface, wherein a metal layer of the mirror is located on a side of the dielectric layer facing away from the reflection surface.

15. The semiconductor laser according to claim 13, wherein the semiconductor layer sequence, viewed in cross-section, is completely enveloped by the electrical contact surfaces together with optically effective coatings.

16. The semiconductor laser according to claim 1, wherein the semiconductor laser is free from a growth substrate of the semiconductor layer sequence.

17. The semiconductor laser according to claim 1, further comprising a potting which is arranged on the at least one facet with the reflection surface, so that the semiconductor laser is cuboidal when viewed in cross-section.

18. A semiconductor laser comprising:
a semiconductor layer sequence and with electrical contact surfaces, wherein
the semiconductor layer sequence comprises a waveguide with an active zone,
the semiconductor layer sequence comprises a first and a second cladding layer between which the waveguide is located,
at least one facet is formed on the semiconductor layer sequence, which has an angle of 45° to a resonator axis and to a main extension direction of the active zone with a tolerance of at most 10°, so that this facet is a reflection surface towards the first cladding layer for laser radiation generated in the active zone during operation, and
a maximum thickness of the first cladding layer at least in a radiation passage region above the reflection surface is between 0.5 M/n and 10 M/n inclusive, and n is the average refractive index of the first cladding layer and M is the vacuum wavelength of maximum intensity of the laser radiation,
wherein the at least one reflection surface is provided with a mirror for the laser radiation, and
wherein the semiconductor layer sequence, viewed in cross-section, is completely enveloped by the electrical contact surfaces together with optically effective coatings.

19. A semiconductor laser comprising:
a semiconductor layer sequence and with electrical contact surfaces, wherein
the semiconductor layer sequence comprises a waveguide with an active zone,
the semiconductor layer sequence comprises a first and a second cladding layer between which the waveguide is located,
at least one facet is formed on the semiconductor layer sequence, which has an angle of 45° to a resonator axis and to a main extension direction of the active zone with a tolerance of at most 10°, so that this facet is a reflection surface towards the first cladding layer for laser radiation generated in the active zone during operation, and
a maximum thickness of the first cladding layer at least in a radiation passage region above the reflection surface is between 0.5 M/n and 10 M/n inclusive, and n is the average refractive index of the first cladding layer and M is the vacuum wavelength of maximum intensity of the laser radiation,
wherein the at least one reflection surface is provided with a mirror for the laser radiation, and
wherein the semiconductor layer sequence, viewed in cross-section along the resonator axis, is shaped as a symmetrical trapezium or as a half trapezium.

20. The semiconductor laser according to claim 19, wherein the at least one reflection surface is provided with a mirror for the laser radiation,
wherein the mirror has a dielectric layer with a refractive index of at most 1.7 for the laser radiation directly on the reflection surface, and
wherein a metal layer of the mirror is located on a side of the dielectric layer facing away from the reflection surface.

* * * * *